United States Patent [19]

O'Neill

[11] 4,151,516
[45] Apr. 24, 1979

[54] PCM CODER WITH SHIFTING IDLE CHANNEL NOISE LEVEL

[75] Inventor: John F. O'Neill, Boulder, Colo.

[73] Assignee: Bell Telephone Laboratories, Incorporated, Murray Hill, N.J.

[21] Appl. No.: 607,778

[22] Filed: Aug. 26, 1975

[51] Int. Cl.$^2$ .............................................. H03K 13/02
[52] U.S. Cl. ...................... 340/347 CC; 340/347 AD; 340/347 M; 307/355; 179/15 AV
[58] Field of Search ................ 340/347 NT, 347 AD, 340/347 CC; 179/15 AV; 328/167; 307/355

[56] References Cited
U.S. PATENT DOCUMENTS

| | | | |
|---|---|---|---|
| 2,787,418 | 4/1957 | MacKnight et al. | 340/347 NT |
| 3,103,629 | 9/1963 | Damen et al. | 325/38 R |
| 3,495,238 | 2/1970 | Gabriel | 340/347 AD |
| 3,755,750 | 8/1973 | Heberling | 328/167 |
| 3,795,900 | 3/1974 | Monford | 340/347 AD |
| 3,984,829 | 10/1976 | Zwack | 340/347 C |

Primary Examiner—Thomas J. Sloyan
Attorney, Agent, or Firm—Rosemary A. Ryan; Charles Scott Phelan; Erwin W. Pfeifle

[57] ABSTRACT

Circuitry useful in PCM coders for effectively shifting the idle channel noise signal to a level midway between the code state boundaries thereby significantly reducing the likelihood that noise signals will cross a boundary and be encoded.

8 Claims, 3 Drawing Figures

PCM CODER WITH SHIFTING IDLE CHANNEL NOISE LEVEL

BACKGROUND OF THE INVENTION

This invention relates to digital signal processing systems and, more particularly, to PCM systems using counting coders.

In counting-type PCM coders, a reference waveform is usually generated. This reference waveform can take the form of a cyclical voltage ramp, perhaps companded, which is compared with successive samples of an input analog signal. At the start of each sampling interval, a counter is activated which generates a count in the form, for example, of an 8-bit digital word, representing the time within the sampling interval at which the input analog sample and the reference waveform correspond.

Idle or quiet channel noise is often a problem in counting-type PCM systems in which analog signals are quantized and digitized. Quantization of the idle channel noise signal produces a signal representing random transitions across a code state boundary. In systems for processing speech signals, this results in an undesirable audible sound.

SUMMARY OF THE INVENTION

The circuit of the present invention substantially reduces or eliminates the deleterious effects of idle channel noise. Specifically, when the channel is idle, the circuit effectively shifts the noise signal to a level midway between the state boundaries of the encoder. The result is that the quiet channel signal is less likely to cross a state boundary and be encoded and decoded to produce an undesirable sound.

DETAILED DESCRIPTION

Figure 1:
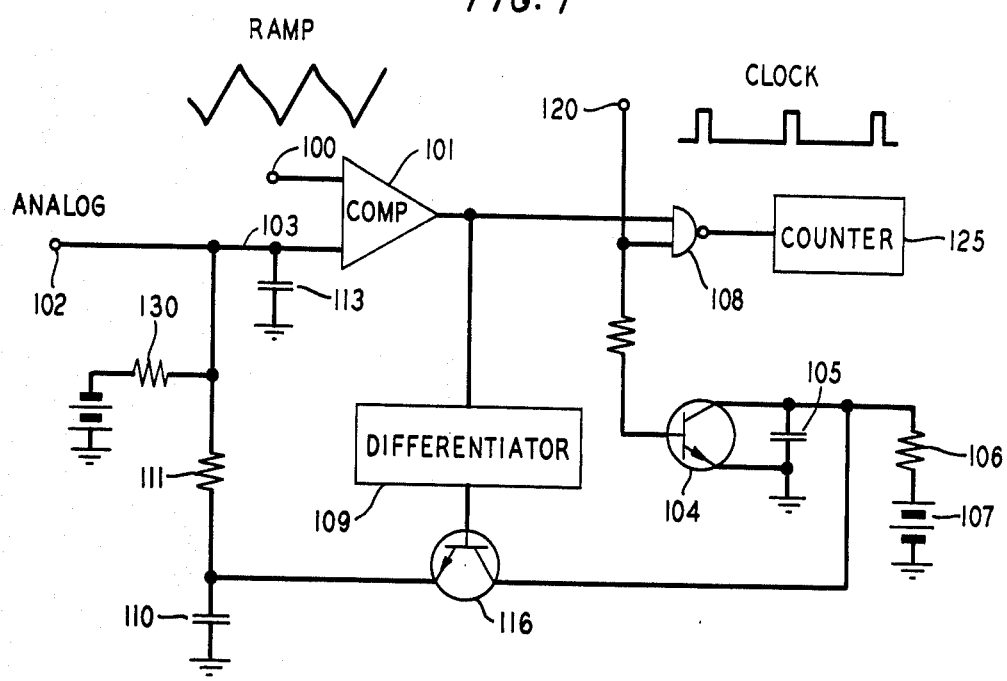
FIG. 1 is a circuit diagram of the preferred embodiment of the present invention.

FIG. 1 shows a counting-type PCM coder in accordance with the principles of the present invention for coding analog, typically audio, signals into digital signals for transmission. Also shown in the figure are two signal waveforms, identified as RAMP and CLOCK, which are generated elsewhere in a system in which this invention may be used. The RAMP signal is applied at input terminal 100 to comparator 101, and the CLOCK signal is applied at terminal 120. Encoding of an ANALOG signal at terminal 102 is accomplished by comparing the ANALOG signal against the RAMP signal. In this embodiment of the invention, the sampling period is equivalent to the period of the RAMP signal, which is equivalent to the period of 256 CLOCK pulses; therefore, the CLOCK pulse frequency if 256 times that of the RAMP.

By means not shown, but known in the art, the average level of the ANALOG signal is biased to approximately midway between the voltage peaks of the RAMP waveform. Such biasing permits the varying ANALOG signal to be compared against the RAMP signal throughout the full amplitude swing of the ANALOG signal. The RAMP waveform, as shown in FIG. 1, has been companded on the negative-going slope so as to be nonlinear. Note that the slope of the negative-going side of the RAMP is steep at the beginning and the end, but is gentler in the middle. Since the amplitude gradient of the coding states is related to the amplitude-time function of the RAMP signal, the amplitude gradient of the coding states is not linear. The use of a companded reference signal is known in the art and provides a higher density of coding states near the middle of the companded RAMP than at either the beginning or end. Thus, since the varying ANALOG signals fluctuate about an average signal level which is near the middle of the RAMP signal, low level ANALOG signals are encoded with a greater number of coding states than would be possible with a linear, noncompanded RAMP signal.

Figure 2:
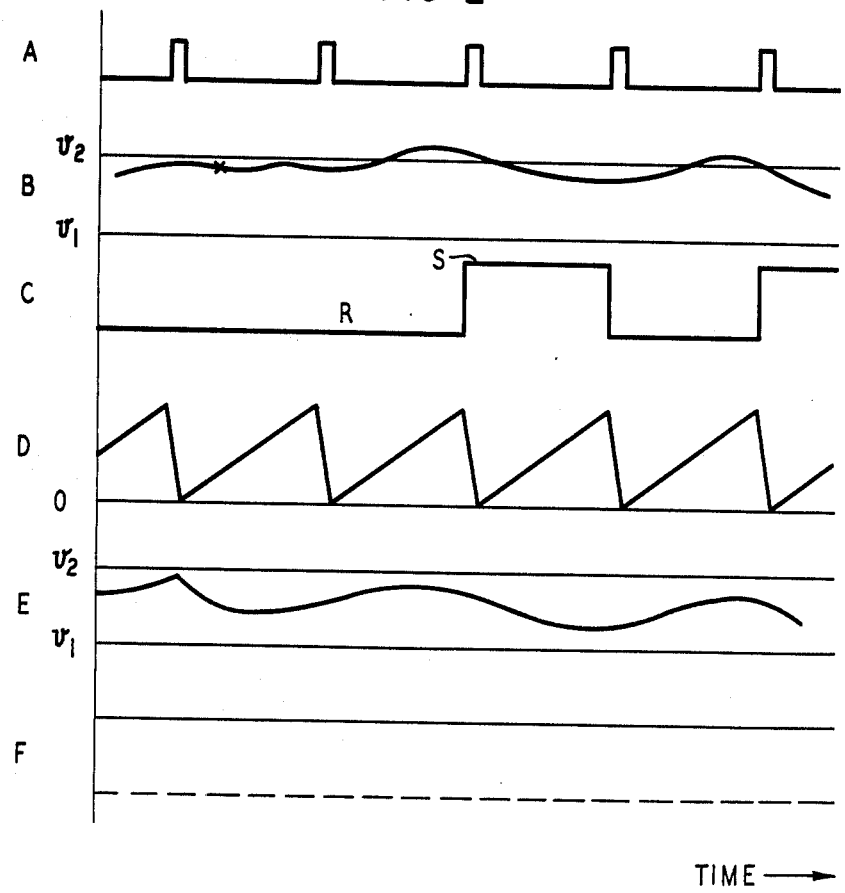
FIG. 2 illustrates timing waveforms useful to an understanding of the operation of the circuit of FIG. 1.

With reference to FIG. 2, waveform A shows the main clock signal and waveform B illustrates a typical idle channel noise signal. Voltage levels $v_1$ and $v_2$, shown with waveform B, represent the corresponding instantaneous voltage levels of the RAMP signal depicted in FIG. 1 at the time of any two consecutive CLOCK pulses. The differential voltage between voltage levels $v_1$ and $v_2$ represents any coding state. In an embodiment of this invention where encoding is accomplished during the negative-going slope of the RAMP signal, the higher voltage level, $v_2$, occurs earlier in time than $v_1$. When the noise signal is below $v_2$, but above $v_1$, it is quantized to a first level (called R on waveform C FIG. 2) and when the noise signal crosses the code boundary $v_2$, it is quantized to a second level (S on waveform C). Waveform C illustrates the quantization of the noise signal, delayed to account for circuit timing. Clearly, the quantization of the idle channel noise signal results in the considerable amplification of that signal.

In accordance with the circuit of FIG. 1, a sampling signal, RAMP, generated elsewhere in the system, is applied to input lead 100 of comparator 101. The sampling waveform, RAMP, shown companded, is illustrated directly on the circuit of FIG. 1. The second input to comparator 101 is the input analog signal, "ANALOG" on FIG. 1, applied to comparator 101 via input terminal 102, lead 103 and capacitor 113. The input analog signal, ANALOG, is compared with the companded sampling signal, RAMP, and a signal generated by comparator 101 whenever the two match. The output from comparator 101 is applied to NAND gate 108 along with the clock signals. The signals generated by gate 108 are used to control counter 125. Specifically, clock pulses are applied to counter 125 via NAND gate 108 while the input from comparator 101 is high signifying a mismatch between the ANALOG and RAMP signals. When comparator 101 changes state, however, NAND gate 108 inhibits clock signals from being applied to the counter. Counter 125 is further arranged to respond to the interruption in the count and inhibit all succeeding clock pulses applied to counter 125 during the sampling interval. Obviously, then, the count in counter 125 represents the elapsed time from the start of a sampling interval to the clock pulse immediately preceding the instant at which the RAMP signal and the ANALOG sample match.

In accordance with the operation of the circuit of FIG. 1, a cyclical sawtooth signal, synchronized to the clock signal A in FIG. 2, is provided. The sawtooth signal is generated as follows. Transistor 104 is operated by the clock signal, waveform A in FIG. 2. Capacitor 105, charged by voltage source 107 and resistor 106, is discharged through transistor 104 when transistor 104 is turned on by the clock signal. Of course, the sawtooth signal, D, can be generated by any conventional means either within the circuit as in FIG. 1 or applied to the circuit from elsewhere in the system.

In the circuit of FIG. 1, assume that each sampling interval corresponds to 256 clock pulses. At the start of an interval, the leading edge of the reference RAMP signal is applied to input terminal 100 of comparator 101 and the beginning of the ANALOG signal to be sampled applied to the other input lead, lead 103, of comparator 101. When the two input signals match, comparator 101 goes low and NAND gate 108 inhibits the next occurring clock pulse. The counter, responsive to the absence of a clock pulse, stops counting. The count (say, 200) in the counter represents the time elapsed from the initiation of the sampling interval to the clock pulse immediately preceding the correspondence of the reference RAMP and the ANALOG sample. This information is coded, transmitted and decoded to construct a simulated version of the sampled ANALOG signal at the decoder.

Looking again at FIG. 1 the output of comparator 101 is also applied to differentiator 109 as well as NAND gate 108. Differentiator 109 generates a voltage spike corresponding to the leading edge of the negative-going state change produced when the input signals match. Several methods are known in the art for generating a positive-going voltage spike in response to a negative-going state change. When comparator 101 changes state, transistor 116 is turned on and the signal at the collector of transistor 104 is applied to capacitor 110. The signal at the collector of transistor 104, is again, the sawtooth signal, waveform D in FIG. 2. In turn, the charge on capacitor 110 is applied via resistor 111 to capacitor 113. When the input signal comprises a small signal close to, but below, a code state boundary, for example "X" on waveform B, comparator 101 changes state and differentiator 109 operates transistor 116 just after a clock pulse. Capacitor 110 is maintained essentially discharged because waveform D is at its lowest value just after a clock pulse. Correspondingly, when the input signal is a small signal close to, but just above, a code state boundary, capacitor 110 is maintained at essentially maximum charge. The result is that a bias voltage is effectively added to the input signal at lead 103 when the input comprises a small slowly varying signal. In the preferred embodiment of the present invention, capacitor 113 is chosen such that the bias on capacitor 110 exerts essentially continuous correcting influence and the input noise signal is biased at or near the middle of the code space, and remote from either boundary, such as $v_2$ in FIG. 2. Thus, no quantizing of this signal occurs unless its amplitude exceeds the correctional range of the voltage on capacitor 110.

Of course, when the channel carries speech signals, the ANALOG signal crosses the state boundary often and the values of waveform D stored on capacitor 110 are essentially random. Some nominal average charge is stored on capacitor 110 and little or not charge is transferred from capacitor 110 to capacitor 113. Accordingly, such a rapidly varying input signal is not dynamically corrected to be contained within a code state as is slowly varying idle channel noise. In accordance with the preferred embodiment of the present invention, capacitor 113 is chosen sufficiently larger than capacitor 110 to cause the idle channel signal to drift halfway between the code state boundaries $v_1$ and $v_2$ when the channel is idle. In addition, resistor 111 is typically arranged to be large enough to delay the transfer of charge over several clock cycles.

As indicated, the average voltage of the ANALOG signal is biased by means not shown to a level approximately midway between the voltage peaks of the RAMP waveform. In embodiments of the invention, such as that shown in FIG. 1, where the encoding side of the RAMP waveform is companded to produce a higher density of coding states near the middle of the waveform, the average voltage level of the ANALOG signal should coincide as closely as practicable with the middle of the RAMP waveform in order that low level ANALOG speech signals be encoded with adequate resolution and the positive-going and negative-going voltage swings of the ANALOG speech signals be symmetrically encoded about such average voltage level. However, when the channel carries speech signals which vary rapidly compared to idle channel noise signals, essentially random values of charge from waveform D are stored on capacitor 110, and a bias voltage level is accumulated on capacitor 110. This results, in this embodiment of the invention, in a bias voltage added to the input ANALOG signal at lead 103. Such a bias at lead 103 is of course positive because transistor 116 conducts only one way, and if not counteracted, will combine additively with the external bias on the input ANALOG signal so as to raise the average voltage level of the input ANALOG signal away from the middle voltage level between the peaks of the RAMP signal. Displacement of the average voltage level of the input ANALOG signal will result in reduced low level signal encoding resolution and asymmetrical encoding of the input ANALOG signal. Resistor 130 operates only to add a small negative bias to input lead 103 which compensates for the above-mentioned positive bias to as to adjust the nominal average bias on the input lead to a level which substantially coincides with the externally biased average voltage level of the input ANALOG signals. In this manner, when a source of ANALOG signals is connected to input lead 103, the overall bias comprising the algebraic sum of the above-mentioned external bias, the positive bias generated by the accumulation of positive charge on capacitor 110, and the negative compensating bias from resistor 130 will cause the ANALOG signal on lead 103 to vary about an average voltage level which is near the middle of the encoding slope of the reference RAMP signal. Although the negative bias provided by resistor 130 is present when input lead 103 carries idle channel noise, this is inconsequential because the thrust of the invention is not to encode the noise, but to contain it within a code state, and the resistor and battery are not operative to effect such containment. In embodiments of this invention where the reference RAMP signal has a linear encoding slope, the amplitude gradient of the coding states is uniformly linear thereby rendering deviations between the average voltage level of the ANALOG signal and the middle voltage of the RAMP waveform to be of small consequence, so long as the voltage peaks of the ANALOG signal do not exceed the voltage peaks of the RAMP waveform.

Waveform E of FIG. 2 illustrates the "corrected" noise signal as contrasted to the "uncorrected" noise signal, B, in FIG. 2. Notice that the corrected idle channel noise signal has been biased to a level midway between the state boundaries thereby essentially eliminating any state boundary crossings. Waveforms C and F shown the resulting quantized version of the uncorrected and corrected noise signal, respectively.

Figure 3:
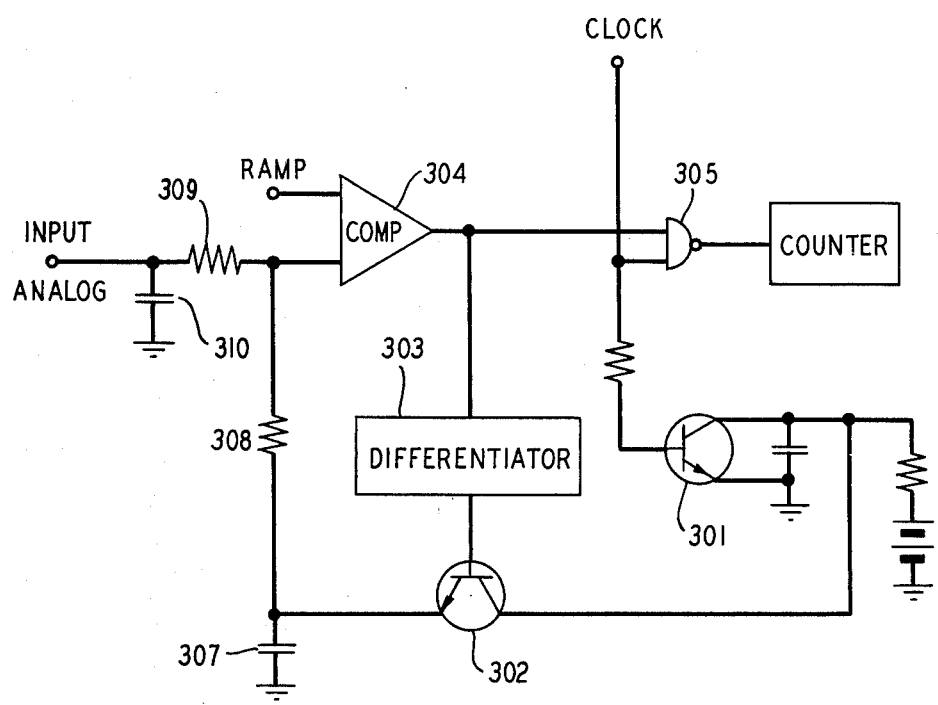
FIG. 3 shows an alternate embodiment of the present invention.

FIG. 3 illustrates an alternative embodiment of the present invention. Just as in the circuit of FIG. 2, in the arrangement of FIG. 3 comparator 304 compares the RAMP signal applied to one lead with the input signal sample applied to the second lead. The output from comparator 304 is simultaneously applied to NAND gate 305 with the clock signal and to differentiator 303. Transistor 302 switches the sawtooth signal produced at the collector of transistor 301 in response to the output from differentiator 303. The charge applied to capacitor 307 via transistor 302 is slowly bled by resistor 308. Resistors 308 and 309 act as a voltage divider to bias the input signal applied to capacitor 310. The choice of resistor values determines the bias added to or deleted from the input signal.

While the invention has been particularly shown and described with reference to a preferred embodiment thereof, it will be understood by those skilled in the art that various changes in form and detail may be made thereto without departing from the spirit and scope of the invention. For example, any suitable commercial or other sawtooth generator could readily be substituted with suitable modifications to the circuits of FIGS. 2 and 3. In addition, the biasing arrangement responsive to the differentiator could, again with suitable circuit modifications, be used to shift the RAMP signal rather than the input sample when the channel is idle.

What is claimed is:

1. In a PCM encoder for converting input analog signals into digital signals, said encoder including means for receiving timing pulses,
   a. a digital counter for counting said timing pulses,
   b. a comparator for comparing said input analog signals applied to a first input lead of said comparator with a cyclically varying reference signal applied to a second input lead of said comparator and for inhibiting said counter when said input analog and reference signals match,
   c. means for accumulating a biasing voltage the magnitude of which is responsive to the period of time ending when said input analog and reference signals match and beginning with a predetermined timing pulse preceding said match, the accumulating means comprising circuitry for generating a sequence of voltage ramps, synchronized with said timing signals, and
   d. biasing means for applying said biasing voltage to one of said input leads of said comparator for adjusting the level of said biasing voltage to cause said input analog and reference signals to match at a point in time substantially midway between consecutive timing pulses.

2. Apparatus as in claim 1 wherein
said reference signal contains a nonlinear coding gradient, which gradient produces code states of different amplitudes symmetrically distributed about a predetermined level on said gradient, and
said biasing means includes circuitry for applying a further biasing voltage of substantially constant, non-zero amplitude to said first input lead, the level of said further biasing voltage being such that the average voltage level on said first input lead is substantially the same as the average voltage level of said input analog signals.

3. Apparatus as in claim 1 wherein said accumulating means includes a first biasing capacitor and gating means responsive to said comparator for controllably applying said voltage ramp signals to said first biasing capacitor.

4. Apparatus as in claim 3 wherein said gating means includes a differentiator for generating short duration voltage pulses in response to the leading edge of the signal generated by said comparator when said input analog signal and said reference signals match and a transistor for connecting said voltage ramp generating circuit to said first biasing capacitor in response to said short duration pulse.

5. Apparatus as in claim 3 wherein said biasing means includes a second biasing capacitor connected to one of said input leads of said comparator and means for conducting charge from said first biasing capacitor to said second biasing capacitor.

6. Apparatus as in claim 5 wherein said biasing means further includes means for averaging the biasing voltage applied to one of said input leads of said comparator over a period of time containing several consecutive events of match between said input analog and reference signals.

7. In a PCM encoder,
   a. means for receiving a sequence of timing pulses,
   b. a comparator for signaling the correspondence of an input analog signal and a cyclically varying reference signal,
   c. a counter responsive to said timing pulses and said comparator signal for generating a binary word representative of the amplitude of the input analog signal and of the one of said timing pulses nearest preceding the instant within a sampling interval at which said input analog and reference signals correspond, and
   d. means for applying a bias signal to an input of said comparator, the magnitude of said bias signal being responsive to the length of time between a first timing pulse and said comparator signal, said bias signal applying means comprising circuitry for generating a sequence of voltage ramps, synchronized with said timing pulses, which voltage ramps are selectively sampled by sampling circuitry in response to said comparator signal, the samples being applied to an input of the comparator to cause said correspondence of said input analog and reference signals to occur at a point in time substantially midway between said first timing pulse and a second timing pulse.

8. A PCM encoder for converting input analog signals into digital signals, said encoder comprising,
   a. means for receiving timing pulses,
   b. a digital counter for counting said timing pulses and thereby defining PCM code states,
   c. a comparator for comparing said input analog signals applied to a first input lead of said comparator with a reference signal applied to a second input lead of said comparator, said reference signal varying cyclically through a predetermined time sequence of voltage levels, each adjacent pair of levels being boundaries of one of said code states, and for inhibiting said counter when said input analog signals and said reference signals match, and
   d. biasing means for applying a biasing voltage to an input lead of said comparator, the biasing means comprising circuitry for generating a sequence of voltage ramps which are sampled by sampling circuitry in response to a signal from said comparator, the magnitude of said biasing voltage being responsive to the magnitude of the voltage ramp samples and the relative magnitude of said input analog and reference signals when said input analog and reference signals match, with respect to the magnitudes of the voltage levels which bound the code state in which said match occurred, to achieve said match substantially midway between said voltage levels.

* * * * *